(12) United States Patent
Fan

(10) Patent No.: US 7,566,963 B2
(45) Date of Patent: Jul. 28, 2009

(54) STACKED ASSEMBLY OF SEMICONDUCTOR PACKAGES WITH FASTENING LEAD-CUT ENDS OF LEADFRAME

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 19 days.

(21) Appl. No.: 11/984,771

(22) Filed: Nov. 21, 2007

(65) Prior Publication Data

US 2009/0127678 A1    May 21, 2009

(51) Int. Cl.
*H01L 23/02* (2006.01)
(52) U.S. Cl. .................... 257/686; 257/678; 257/696
(58) Field of Classification Search ................ 257/678, 257/686, 690, 693, 696, E23.042, E25.031
See application file for complete search history.

(56) References Cited

U.S. PATENT DOCUMENTS 4,272,140 A * 6/1981 Lychyk et al. ................ 439/70
5,081,764 A * 1/1992 Utunomiya et al. ........... 29/843
5,271,147 A * 12/1993 Ogata ......................... 29/827

* cited by examiner

*Primary Examiner*—Phuc T Dang
(74) *Attorney, Agent, or Firm*—Muncy, Geissler, Olds & Lowe, PLLC

(57) ABSTRACT

A stacked assembly of semiconductor packages primarily comprises a plurality of stacked semiconductor packages. Each semiconductor package includes an encapsulant, at least a chip, and a plurality of external leads of a leadframe, where the external leads are exposed and extended from a plurality of sides of the encapsulant. Each external lead of an upper semiconductor package has a U-shaped cut end when package singulation. The U-shaped cut ends are configured for locking to the soldered portion of a corresponding external lead of a lower semiconductor package where the U-shaped cut ends and the soldered portions by soldering materials. Therefore, the stacked assembly has a larger soldering area and stronger lead reliability to enhance the soldering points to against the effects of impacts, thermal shocks, and thermal cycles.

8 Claims, 6 Drawing Sheets

STACKED ASSEMBLY OF SEMICONDUCTOR PACKAGES WITH FASTENING LEAD-CUT ENDS OF LEADFRAME

FIELD OF THE INVENTION

The present invention relates to a high-density 3D (three-dimensional) stacking technology of multiple semiconductor packages, especially to stacking leadframe-based packages by soldering at the lead-cut ends of the leadframes.

BACKGROUND OF THE INVENTION

As the electronic products become smaller and smaller, the available surfaces of printed circuit boards for mounting semiconductor packages become smaller and smaller as well. The conventional side-by-side placement of semiconductor packages on a printed circuit board can not meet the requirements for miniature electronic devices. Therefore, 3D stacking technologies of semiconductor packages are developed to vertically stack a plurality of semiconductor packages to become a Package-On-Package device (POP), to meet the requirements of smaller footprints with higher density of components. In order to consider the cost and the utilization of the existing equipment, leadframe-based packages can be stacked by soldering the external leads of leadframes.

As shown in FIG. 1 and FIG. 2, a conventional stacked assembly 100 of semiconductor packages primarily comprises a first semiconductor package 110 and at least a second semiconductor package 120 stacked on top of the first semiconductor package 110. The first semiconductor package 100 is a conventional leadframe-based package comprising a chip 111, a plurality of external leads 112 of a leadframe, and an encapsulant 113 where the external leads 112 are configured for surface-mounting on an external printed circuit board, not shown in the figure. The second semiconductor package 120 comprises a chip 121, a plurality of external leads 122 of a leadframe, and an encapsulant 123. The external leads 122 of the second semiconductor package 120 exposed from the encapsulant 123 are formed in "I" shape are electrically connected to the external leads 112 of the first semiconductor package 110 by soldering materials 130 at the soldered sections of the external leads 112 close to the encapsulant 113. However, since the soldering area is small and narrow, the leads 122 are easily shifted due to thermal or mechanical stress. When the conventional stacked assembly 100 encounters thermal cycles, thermal shock, or drop test, the soldering materials 130 or the soldered sections between the leads 122 and leads 112 are easily broken.

SUMMARY OF THE INVENTION

The main purpose of the present invention is to provide a stacked assembly of semiconductor packages having soldered joints at a plurality of lead-cut ends of a leadframe to increase the adhesion and the soldering area of the leads to enhance the reliability under external impacts.

The second purpose of the present invention is to provide a stacked assembly of semiconductor packages soldering at the lead-cut ends of the leadframe to prevent breaking of the soldering points without increasing the manufacturing cost of leadframes nor the stacking processes.

According to the present invention, a stacked assembly of semiconductor packages primarily comprises a first semiconductor package and at least a second semiconductor package where the first semiconductor package comprises at least a first chip, a plurality of first external leads of a leadframe, and a first encapsulant. The second semiconductor package is mounted onto the first semiconductor package. The second semiconductor package comprises at least a second chip, a plurality of second external leads of a leadframe, and a second encapsulant where the second external leads are exposed and extended from a plurality of sides of the second encapsulant. Each second external lead has a U-shaped cut end locking to the soldered section of the corresponding first external lead close to the first encapsulant. It can increase the solder area between the leads to enhance the reliability of the stacked assembly under external impacts. Also, a stackable semiconductor package for the stacked assembly is also revealed.

DETAIL DESCRIPTION OF THE INVENTION

Please refer to the attached drawings, the present invention will be described by means of embodiment(s) below.

Figure 1:
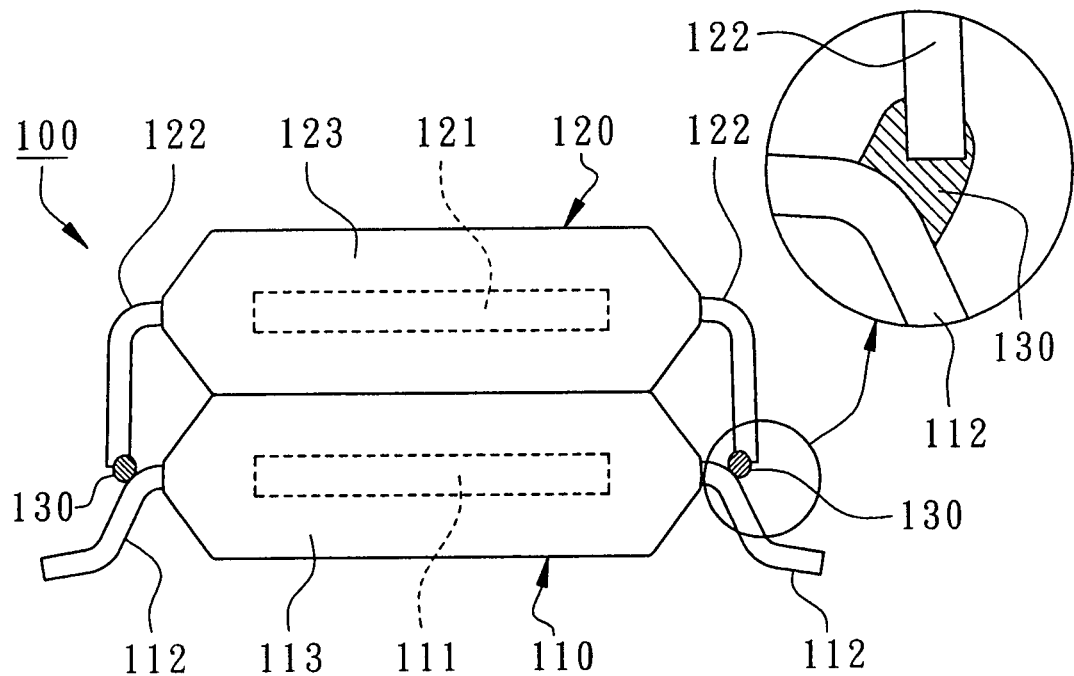
FIG. 1 shows a front view of a conventional stacked assembly of semiconductor packages.
Figure 2:
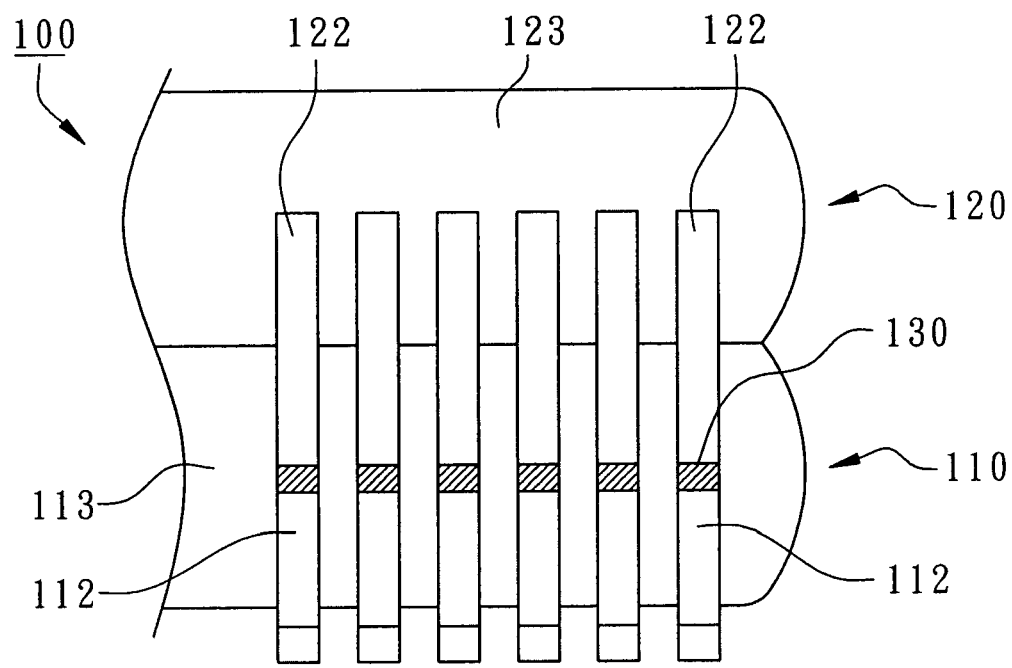
FIG. 2 shows a partial side view of a conventional stacked assembly of semiconductor packages.
Figure 3:
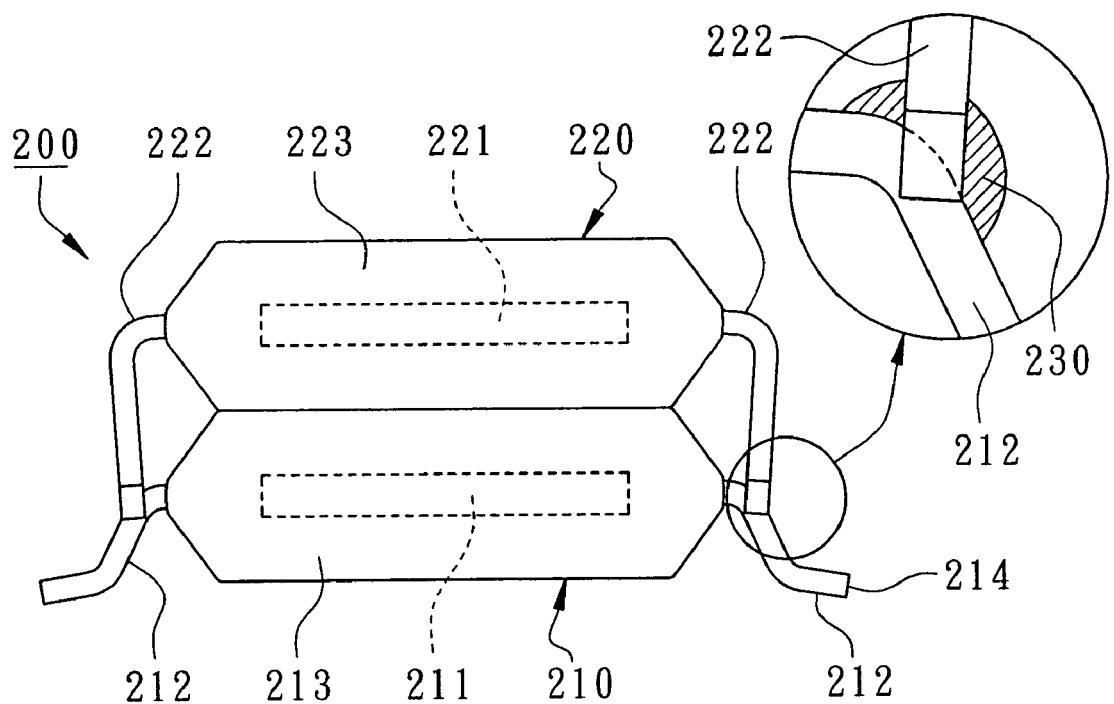
FIG. 3 shows a front view of a stacked assembly of semiconductor packages according to the first embodiment of the present invention.
Figure 4:
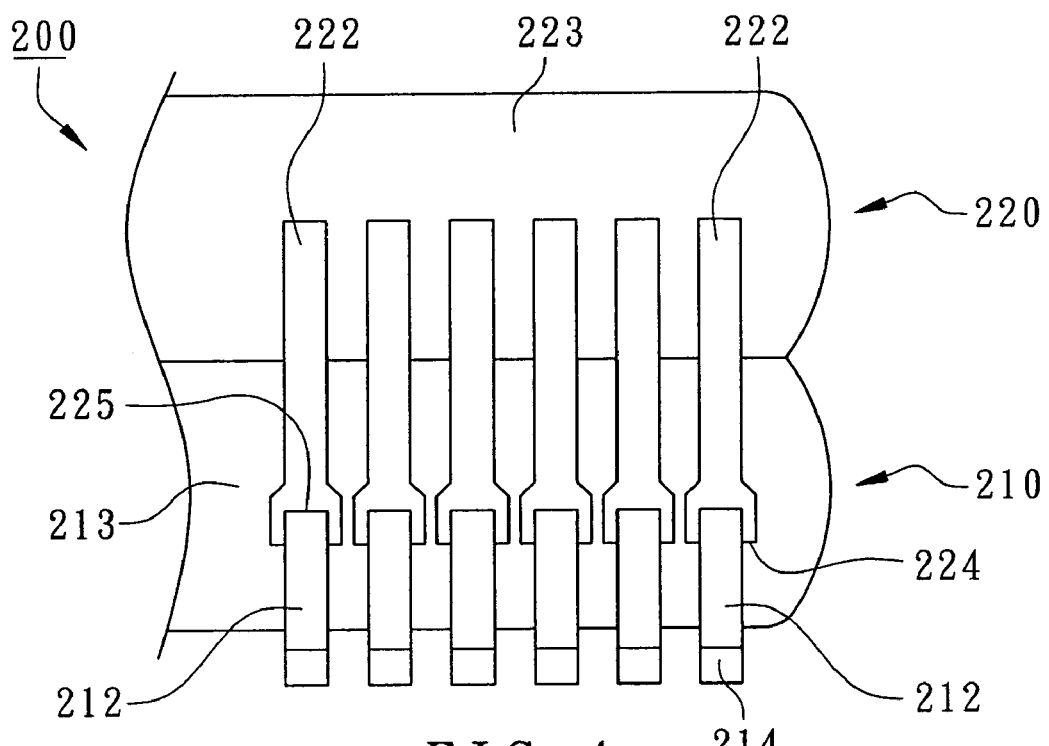
FIG. 4 shows a partial side view of the stacked assembly of semiconductor packages according to the first embodiment of the present invention.

According to the first embodiment of the present invention, a stacked assembly of leadframe-based semiconductor packages is revealed, as shown in FIG. 3 and FIG. 4. As shown in FIG. 3, a stacked assembly 200 primarily comprises a first semiconductor package 210 and at least a second semiconductor package 220 above the first semiconductor package 210. The first semiconductor package 210 can be a single-chip package or multi-chip package, including at least a first chip 211, a plurality of external leads 212 of a leadframe, and a first encapsulant 213. The first chip 211 is electrically connected to the first external leads 212 by bonding wires or flip chip bumps and is encapsulated by the first encapsulant 213. The first external leads 212 are exposed and extend from two opposing sides or the peripherial sides of the first encapsulant 213. In the present embodiment, the first external leads 212 are gull-wing leads and have a plurality of cut ends 214 far away from the second external leads 222.

Figure 5:
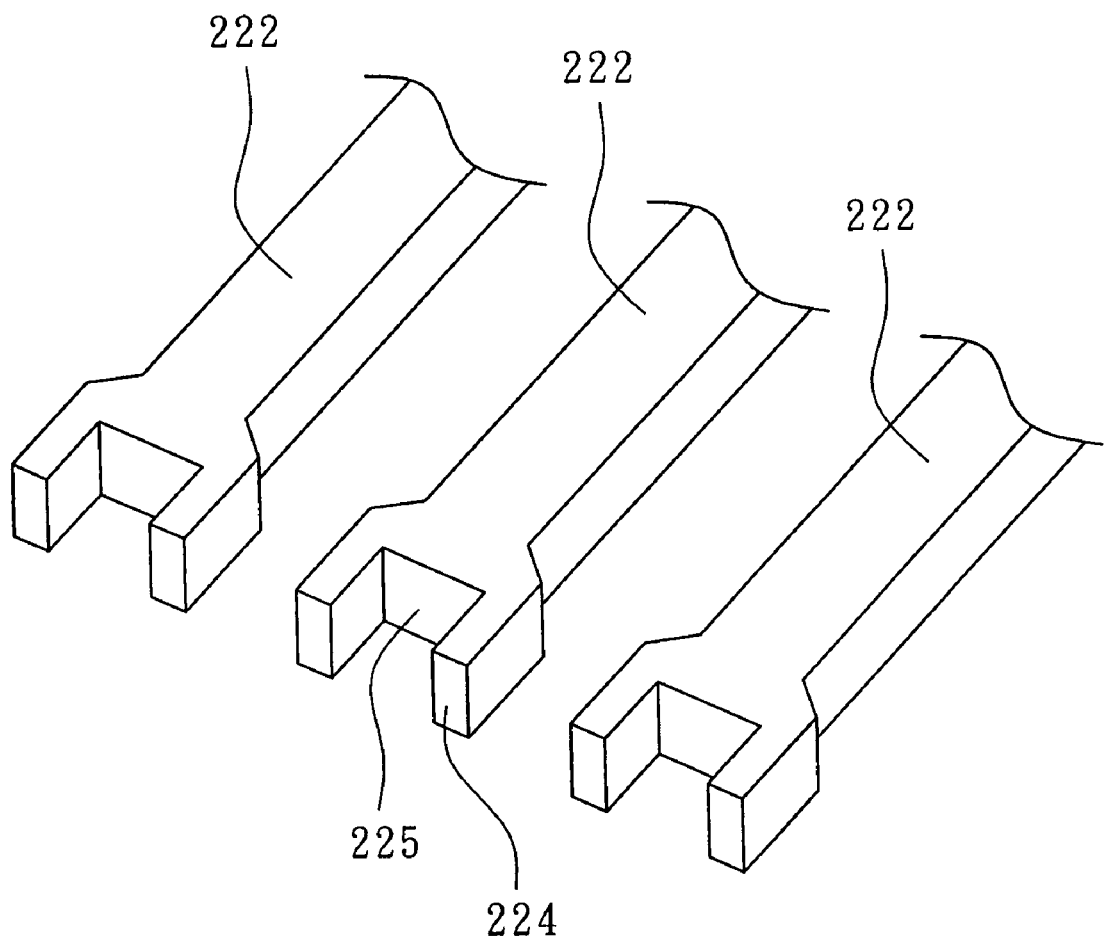
FIG. 5 shows a partially enlarged view of a plurality of external leads of a semiconductor package from the stacked assembly according to the first embodiment of the present invention.

The second semiconductor package 220 is mounted onto the first semiconductor package 210 by soldering materials 230. The second semiconductor package 220 includes at least a second chip 221, a plurality of external leads 222 of a leadframe, and a second encapsulant 223. The external leads 222 are parts of a leadframe for electrically connecting the second chip 221. The second external leads 222 are exposed from the second encapsulant 223 at two opposing sides or at the peripheries. As shown in FIG. 5, each second external lead 222 has a U-shaped cut end 224 having a locking indentation 225 where the cut end 224 is a lead end cut when package singulation. The cut ends 224 lock to the corresponding soldered sections of the first external leads 212 by the locking indentations 225 to increase the soldered area of the second external leads 222 leading to better absorption of stresses. Therefore, the reliability of the stacked assembly 200 under thermal or mechanical stresses such as impacts, drop, thermal cycles, and thermal shocks is greatly enhanced.

In this embodiment, the first chip 211 and the second chip 221 are memory chip such as flash or DRAM to increase memory capacities without increasing the SMT footprints.

Moreover, the soldered sections of the first external leads 212 are located close to the first encapsulant 213 or close to the bent shoulders of the first external leads 212. The second external leads 222 are in vertical "I" shapes and the lead-cut ends 224 extend towards the first external leads 212 so that the lead-cut ends 224 of the second external leads 222 are locked with the corresponding soldered sections of the first external leads 212 by the locking indentations 225 and are soldered together by soldering materials 230.

As shown in FIG. 3, soldering materials 230 electrically connect the lead-cut ends 224 of the second external leads 222 to the corresponding soldered sections of the first external leads 212. Preferably, the opening widths of the locking indentations 225 of the second external leads 222 are approximately equal to the ones of the first external leads 212 to avoid lead displacement of the second external leads 222 caused by thermal stresses during high temperature soldering leading to "cold soldering" or "fault soldering".

Preferably, the second encapsulant 223 can stack and contact the first encapsulant 213 to reduce the stacking height and to disperse the exerted stresses on the second external leads 222.

Figure 6:
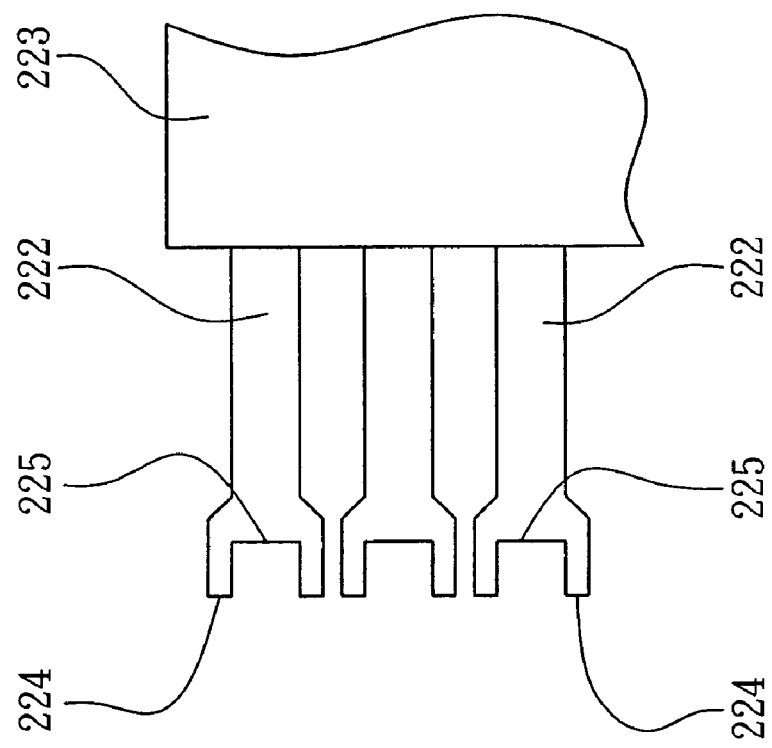
FIG. 6 shows a partial view of the external leads of the semiconductor package after molding and before singulation according to the first embodiment of the present invention.
Figure 6:
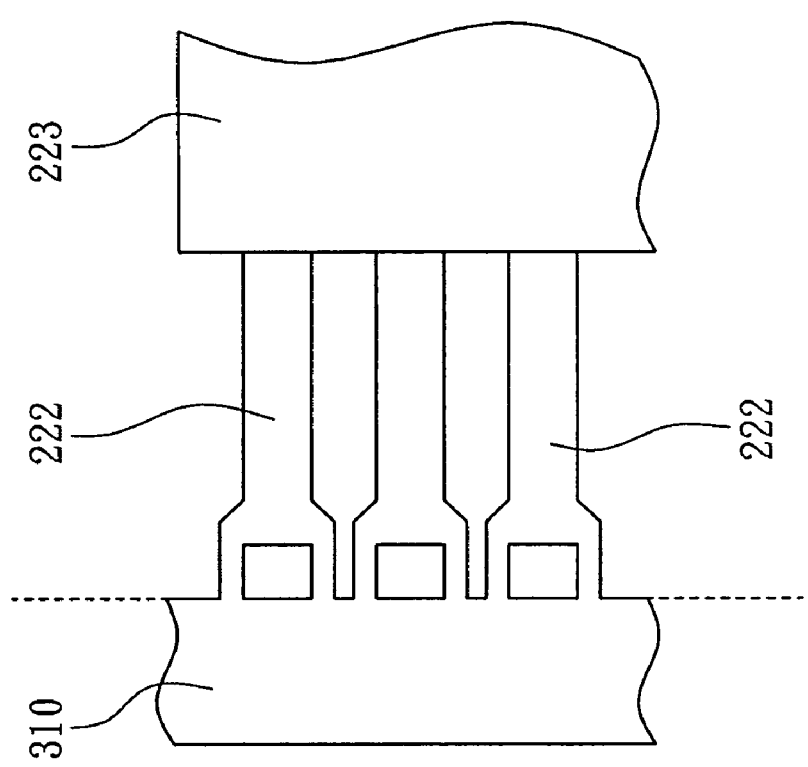

Furthermore, as shown in FIG. 5, the locking indentation 225 is formed at the middle of the lead-cut end 224 of the second external lead 222. During the packaging of the second semiconductor package 220, the locking indentation 225 is not formed yet from providing a leadframe until molding. As shown in FIG. 6, even after forming the second encapsulant 223, the second external leads 222 are mechanically connected to the tie bar 310 of a leadframe where the second external leads 222 and the tie bar 310 are made of the same metal and integral from the leadframe. There is a cutting line between the second external leads 222 and the tie bar 310 for package singulation (as shown in FIG. 6). Moreover, the location of the locking indentation 225 is just a hole. During package singulation, the tie bar 310 of the leadframe is cut off to separate from the second external leads 222 where the lead-cut end 224 and the locking indentation 225 are formed at the same time. After package singulation, the second external leads 222 are followed the conventional trim and form processes. Therefore, the formation of the locking indentations 225 will not increase the cost of leadframes nor process flow to avoid breaking of the soldering points.

Figure 7:
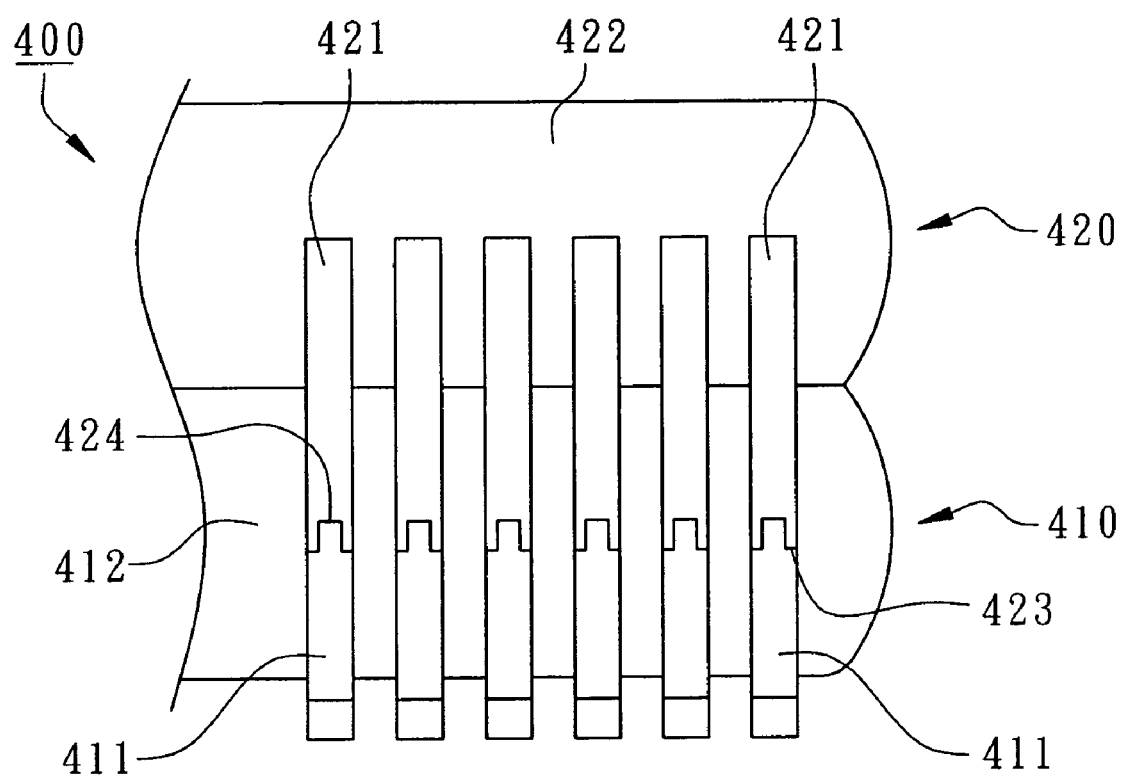
FIG. 7 shows a partial side view of a stacked assembly of semiconductor packages according to the second embodiment of the present invention.
Figure 8:
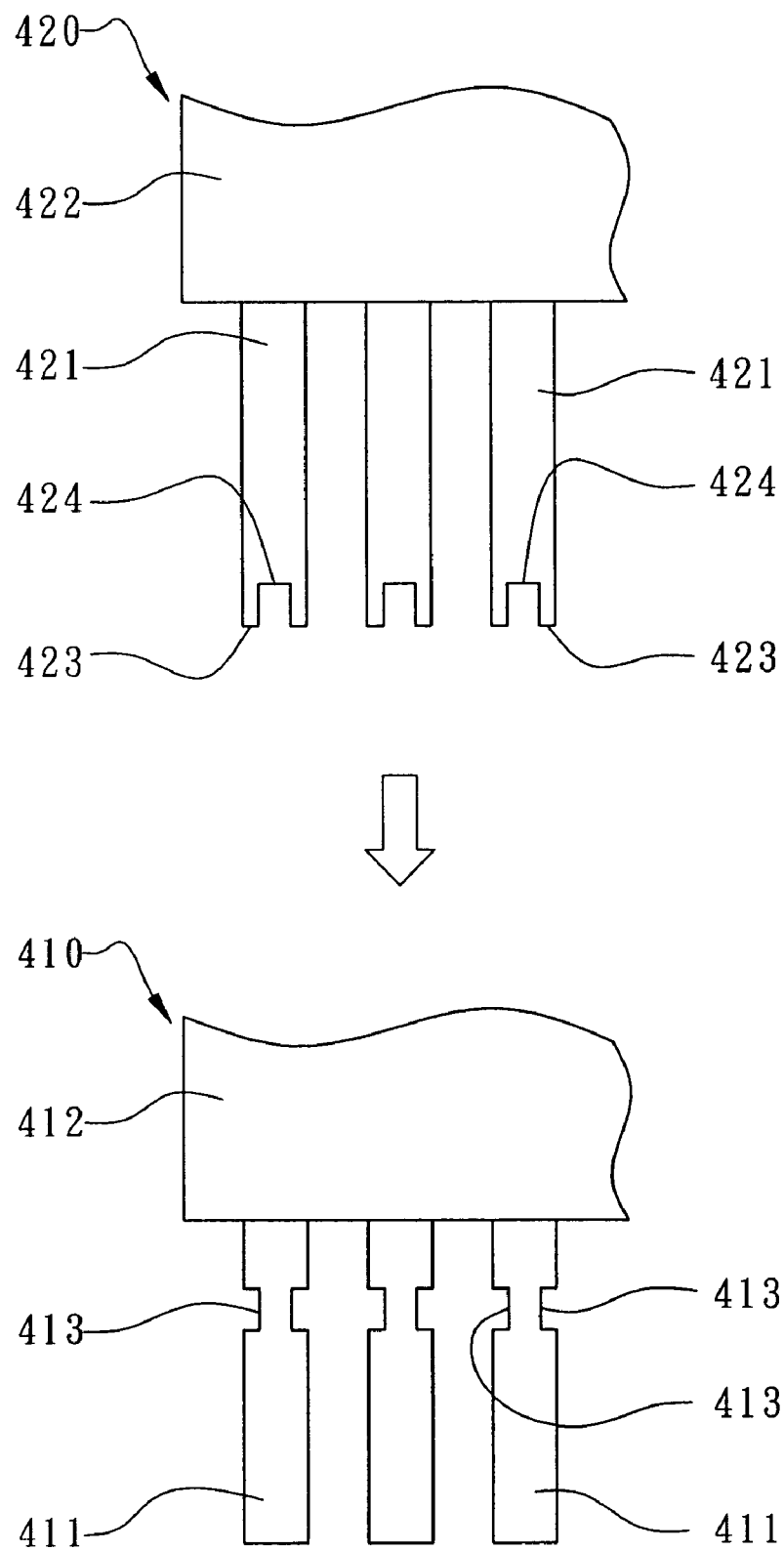
FIG. 8 shows the external leads of semiconductor packages from the stacked assembly according to the second embodiment of the present invention.

Various shapes of the external leads are revealed in FIG. 7 and FIG. 8 according to the second embodiment of the present invention. A stacked assembly 400 primarily comprises a first semiconductor package 410 and at least a second semiconductor package 420. The major components are the same as the first embodiment. The first semiconductor package 410 includes an encapsulant 412 encapsulating a chip and a plurality of external leads 411 of a leadframe which are exposed and extended from the first encapsulant 412. The second semiconductor package 420 is mounted onto the first semiconductor package 410. The second semiconductor package 420 includes a second encapsulant 422 encapsulating a chip and a plurality of second external leads 421 exposed and extending from the second encapsulant 422. Each second external lead 421 has a U-shaped lead-cut end 423 having a locking indentation 424. The lead-cut ends 423 of the second external leads 421 are soldered and locked to the corresponding soldered sections of the first external leads 411 by the locking indentations 424 to increase the soldered areas of the second external leads 421 leading to better absorption of stresses. As shown in FIG. 8, the lead widths of the lead-cut ends 423 of the second external leads 421 are not greater than the one of the corresponding second external lead 421 because at least a side indentation 413 is formed on each first external lead 411 close to the first encapsulant 412 to reduce the width of the first external leads 411 at the soldered section to provide better locking effects of the locking indentations 424. The soldering area between the lead-cut end 423 of the second external lead 421 and the first external lead 411 is increased to avoid lead displacement of the second external lead 421 caused by thermal stresses during high temperature soldering leading to "cold soldering" or "fault soldering", or by mechanical stress.

The above description of embodiments of this invention is intended to be illustrative and not limiting. Other embodiments of this invention will be obvious to those skilled in the art in view of the above disclosure.

What is claimed is:

1. A stacked assembly of semiconductor packages comprising:
 a first semiconductor package including a first encapsulant, at least a first chip inside the first encapsulant, and a plurality of first external leads of a leadframe, wherein the first external leads are exposed and extended from a plurality of sides of the first encapsulant;
 at least a second semiconductor package mounted onto the first semiconductor package, the second semiconductor package including a second encapsulant, at least a second chip inside the second encapsulant, and a plurality of second external leads of a leadframe, wherein the second external leads are exposed and extended from a plurality of sides of the second encapsulant;
 wherein each second external lead has a U-shaped cut end locking to a soldered section of the corresponding first external lead; and
 soldering materials electrically connecting and mechanically bonding the lead-cut ends of the second external leads to the soldered sections of the first external leads.

2. The stacked assembly as claimed in claim 1, wherein each U-shaped cut end has a locking indentation approximately equal to the lead width of the corresponding first external lead.

3. The stacked assembly as claimed in claim 1, wherein each U-shaped cut end has a lead width not greater than the lead width of the corresponding first external lead, moreover, the soldered section of the corresponding first external lead has at least a side indentation to reduce the width of the soldered section.

4. The stacked assembly as claimed in claim 1, wherein the soldered sections are adjacent to a plurality of bent shoulders of the corresponding first external leads.

5. The stacked assembly as claimed in claim 1, wherein the first external leads are gull-wing leads and have a plurality of cut ends far away from the second external leads.

6. The stacked assembly as claimed in claim 1, wherein the second encapsulant is stacked to contact the first encapsulant.

7. A semiconductor package for mounting onto another semiconductor package, primarily comprising an encapsulant, a chip inside the encapsulant, and a plurality of external leads of a leadframe, wherein the external leads are exposed and extended from a plurality of sides of the encapsulant, wherein each external lead has a U-shaped cut end for locking to a soldered section of a corresponding external lead of the package stacked below; wherein each U-shaped cut end has a locking indentation approximately equal to the lead width of the corresponding external lead of the package stacked below.

8. A semiconductor package for mounting onto another semiconductor package, primarily comprising an encapsulant, a chip inside the encapsulant, and a plurality of external leads of a leadframe, wherein the external leads are exposed and extended from a plurality of sides of the encapsulant, wherein each external lead has a U-shaped cut end for locking to a soldered section of a corresponding external lead of the package stacked below; wherein each U-shaped cut end has a lead width not greater than the lead width of the corresponding external lead.

\* \* \* \* \*